(12) United States Patent
Sywyk et al.

(10) Patent No.: US 6,195,277 B1
(45) Date of Patent: Feb. 27, 2001

(54) MULTIPLE SIGNAL DETECTION CIRCUIT

(75) Inventors: Stefan P. Sywyk, San Jose; Eric H. Voelkel, Ben Lomond; Sow T. Chu, Cupertino, all of CA (US)

(73) Assignee: Lara Technology, Inc., San Jose, CA (US)

( * ) Notice: Subject to any disclaimer, the term of this patent is extended or adjusted under 35 U.S.C. 154(b) by 0 days.

(21) Appl. No.: 09/394,232

(22) Filed: Sep. 13, 1999

(51) Int. Cl.[7] .................................................. G11C 15/00
(52) U.S. Cl. .......................................... 365/49; 365/189.07
(58) Field of Search ................................ 365/49, 189.07, 365/210, 189.05, 203

(56) References Cited

U.S. PATENT DOCUMENTS

| | | | |
|---|---|---|---|
| 5,446,686 | * 8/1995 | Bosnyak et al. | 365/49 |
| 5,796,758 | 8/1998 | Levitan | 371/49.1 |
| 5,852,569 | * 12/1998 | Srinivasan et al. | 365/49 |
| 5,893,931 | 4/1999 | Peng et al. | 711/206 |

* cited by examiner

*Primary Examiner*—David Nelms
*Assistant Examiner*—David Lam
(74) *Attorney, Agent, or Firm*—Bradley T. Sako (57) ABSTRACT

According to one embodiment, a multiple signal detect circuit (100) can include a detect node (102) and a reference node (104). The potential of the detect node (102) can be discharged (or charged) at a rate that depends upon the number of active input signals (M1 to Mn). The potential of the reference node (104) can be discharged (or charged) at a reference rate. The reference rate can be greater than the rate at which the detect node (102) is discharged (or charged) when one input signal is activated, and less than the rate at which the detect node (102) is discharged (or charged) when two input signals are activated. A differential voltage between the detect node (102) and reference node (104) can be amplified by an amplifier (110).

20 Claims, 5 Drawing Sheets

BACKGROUND ART

FIG. 5

BACKGROUND ART

MULTIPLE SIGNAL DETECTION CIRCUIT

TECHNICAL FIELD

The present invention relates generally to circuits that can receive a number of input signals and determine how many input signals are active, and more particularly to circuits that can detect when two or more input signals are active.

BACKGROUND OF THE INVENTION

Many system and/or integrated circuit applications can include a number of signals that can be placed into one or more states. It can be useful in some applications to determine when two or more signals are activated. One such application is a content addressable memory (CAM).

A typical CAM can store a number of data values in a CAM cell array. In a match operation, the data values can be compared to a comparand value (also referred to as a "search key"). A data value that matches the comparand value can result in a match indication. For some applications it can be desirable to determine when more than one match indication is generated. Such a determination can indicate an error condition, or the need to activate a priority circuit to select from among the multiple match indications. In this way, multiple match indications can be advantageous if used in (or in conjunction with) a CAM device.

A current common application for a CAM and CAM devices is in network hardware that routes and/or switches network data packets. As just one example, a router and/or network switch can use a matching function to match packet-processing criteria with information in a packet header. The packet can then be processed accordingly. "High-Traffic" routers and/or network switches can process thousands of packets in only a short amount of time. Accordingly, in order to reduce the overall packet processing time, it can be desirable to reduce the time for various CAM functions. One such function can be a multiple match detect function.

A multiple match detect function can have a number of applications in a CAM. As one example, a CAM can include an "occupied bit" for each entry that can indicate if an entry contains valid data. A multiple match detect circuit can indicate when there are more than a minimum number of occupied entries. In the event the minimum number of unoccupied entries falls below the minimum value, the CAM can provide an indication that it is almost "full." A typical CAM can include match lines that can each provide a match indication for a given data value. In order to determine a multiple match condition, the various match lines of a CAM can be monitored to determine when more than one match indication is generated.

A straightforward logical combination could include the approach set forth below.

$$MM = M1*M2 + M1*M3 + M2*M3$$

Where MM indicates a multiple match condition when high, and M1 to M3 represent the various match indications. The match indications are assumed to be active when high. Thus, utilizing the logical combination of match indication pairs, three logic pairs are required for a multiple match detection function. This approach can be generalized into the following relationship $$\text{Pairs} = \frac{n!}{(n-2)! - 2!}$$

where "n" is the number of match lines, and "Pairs" is the number of match pair combinations that can be required to detect a multiple match indication.

While the conventional logical approach set forth above can be implemented for smaller numbers of match indications, such an approach is not always practical for the large number of match indications generated in higher density CAMs. Some CAM architectures can include one or more sectors, with each sector having a large number of match lines. A conventional logic approach for such a large number of match lines can be prohibitively large to implement and/or add too much delay to a multiple match function. As just one example, a sector having 2048 match lines could require the logical combination of 2,096,128 match indication pairs. If two-input logic gates (such as NAND, AND, OR or NOR gates) are used, 2,096,128 such gates could be required just to accomplish the initial AND function. It is understood that larger input logic gates could be employed, but such larger input logic gates have a proportional or correspondingly larger number of active devices (such as transistors).

Another approach for multiple match detection is a "wire-NOR" (or "wire-OR") type circuit. One example of a wire-NOR approach to multiple match detection is set forth in FIG. 5. The multiple match detect circuit is designated by the general reference character 500 and is shown to include a detect node 502 (a "wire") having a number of corresponding detect devices 504-1 to 504-n. Each detect device (504-1 to 504-n) can be activated by a corresponding match indication (M1 to Mn). When activated, a detect device (504-1 to 504-n) can couple the detect node 502 to a predetermined voltage. In the particular case of FIG. 5, each detect device (504-1 to 504-n) can discharge the detect node 502 to a lower power supply voltage VSS when activated. The detect devices (504-1 to 504-n) can be n-channel insulated gate field effect transistors (referred herein as "MOS" transistors) of the same size (i.e., having the same size channel width and length).

Figure 5:
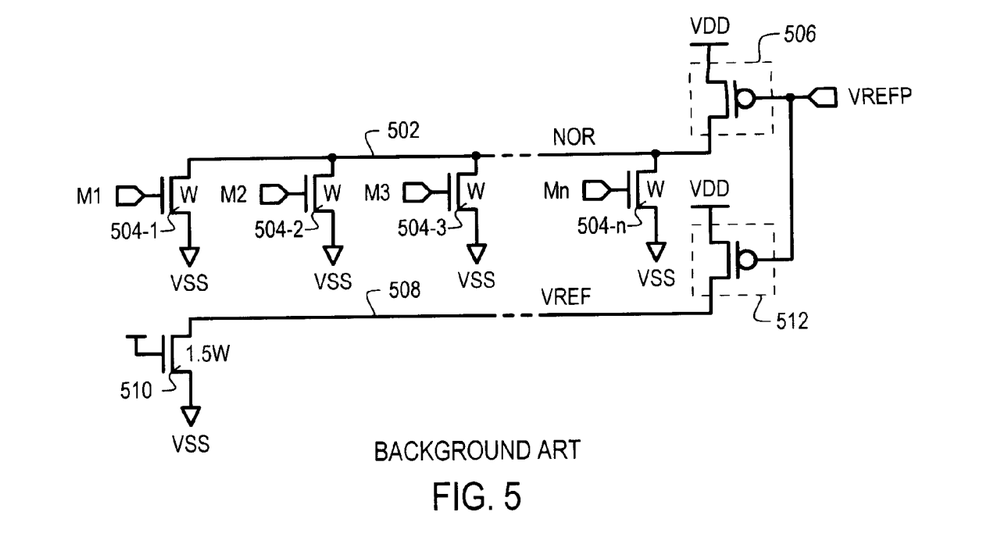
FIG. 5 is a schematic diagram of a conventional multiple signal detect circuit.

Also included in FIG. 5 is a detect load 506. A detect load 506 can help to maintain the detect node 502 above a predetermined potential, provided one, or none of the detect devices (504-1 to 504-n) is activated. However, in the event more than one detect device (504-1 to 504-n) is activated, the detect node 502 may be driven below a predetermined potential, and thereby detect a multiple match condition. The detect load of FIG. 5 is a p-channel MOS transistor, with a reference voltage VREFP applied to its gate.

In the particular arrangement of FIG. 5, a multiple match indication can be generated when the detect node 502 potential is driven a predetermined amount below a reference voltage VREF. The VREF voltage can be generated on a reference node 508 by a reference device 510 and a reference load 512. In FIG. 5, the reference load 512 can "match" the detect load 506. In FIG. 5, a matching reference load 512 can be formed with a transistor having the same size, and receiving the same reference voltage (VREFP) at its gate.

A response that distinguishes between a one match indication and multiple match indications can be accomplished by sizing the reference device 510. In the particular case of FIG. 5, this can be accomplished by using a transistor having the same channel length, but 1.5 times the channel width of the detect device (504-1 to 504-n) transistors.

Figure 6:
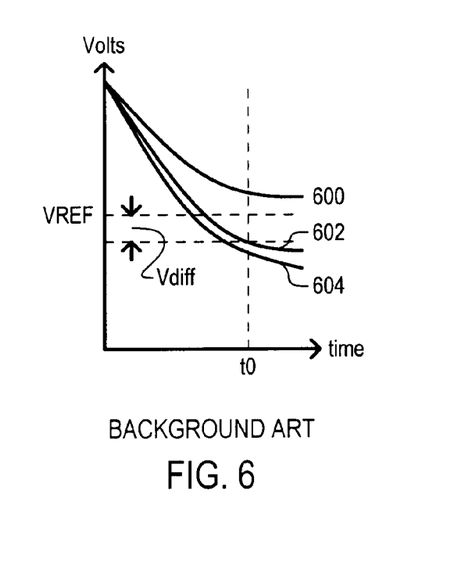
FIG. 6 is a timing diagram illustrating the operation of the circuit set forth in FIG. 5.

To better understand the operation of the circuit of FIG. 5, a timing diagram is set forth in FIG. 6. FIG. 6 illustrates three different responses at the detect node 502 according to different match indication results. Response 600 represents an operation in which one match indication is generated. Consequently, one detect device (504-1 to 504-n) is activated. However, due to the detect load 506, the single activated detect device cannot "overpower" the detect load 506, and the detect node 502 remains above the VREF potential at time t0.

Response 602 represents an operation in which two match indications are generated. Consequently, two detect devices (504-1 to 504-n) are activated. The two activated detect device can discharge the detect node 502 to a voltage that is below the VREF voltage generated on the reference node 508. Thus, if the detect node 502 voltage>VREF, there is no multiple match. However, if the detect node 502 voltage<VREF, a multiple match condition exists. At time t0, the potential between the detect node 502 and the reference node 508 can reach a value Vdiff. This value can be used by other circuits to determine a multiple match condition.

Response 604 represents an operation in which three match indications are generated. With three detect devices (504-1 to 504-n) activated, the detect node 502 can be discharged at a faster rate, and hence develop a Vdiff potential between the detect node 502 and the reference node 508 in a shorter amount of time.

Other variations on the approach set forth in FIG. 5 can include precharge techniques, where the detect node and/or reference node can be precharged to a potential prior to the generation of match indications.

While the multiple match detect approach of FIG. 5 can be implemented with a smaller overall circuit than the previously described conventional logic approach, it is still desirable to provide a multiple match detect circuit that may have an even more rapid response.

SUMMARY OF THE INVENTION

According to at least one of the disclosed embodiments, a multiple match detect circuit can include a first node and a second node that can be set to a first potential. The first node can be discharged (or charged) toward a second potential by a plurality of input signals. The discharge (or charge) rate can vary according to the number of active input signals. The second node can be discharged (charged) at a reference rate. A differential voltage between the first and second nodes can be used to determine if more than one input signal is active.

According to one aspect of the embodiments, a differential amplifier can detect a differential voltage between the first node and the second node to determine if more than one input signal is active.

According to another aspect of the embodiments, the first and second nodes can be precharged (or predischarged) to a starting potential prior to the activation of any input signals.

According to another aspect of the embodiments, a differential voltage between the first node and second node can be amplified and latched according to the potential at the second node.

According to another aspect of the embodiments, a number of detect discharge (or charge) devices can be coupled to the first node, each discharge (or charge) device being activated by an input signal. One or more "dummy" discharge (or charge) devices can be coupled to the second node. The dummy discharge (or charge) devices can help to provide similar discharge (or charge) properties between the first and second nodes. One such property can be an inherent capacitance present in the detect discharge (or charge) devices.

According to another aspect of the embodiments, the input signals are match indication signals generated from a number of match lines. Each match line can be coupled to an entry, comprised of a row of content addressable memory (CAM) cells.

DETAILED DESCRIPTION OF THE EMBODIMENTS

Various embodiments will now be disclosed of a multiple signal detect circuit according to the present invention. A first embodiment is set forth in a block diagram in FIG. 1, and designated by the general reference character 100. The first embodiment 100 can receive a number of input signals M1 to Mn and provide a output signal MM. The MM signal can be activated when two or more of the input signals (M1 to Mn) are active.

Figure 1:
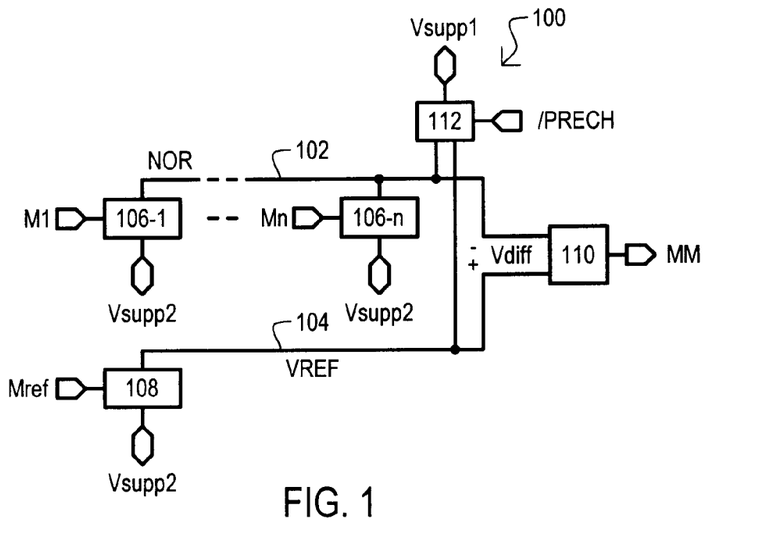
FIG. 1 is a block diagram of a multiple signal detection circuit according to a first embodiment.

The first embodiment 100 is shown to include a detect node 102 and a dynamic reference node 104. The detect node 102 can include a detect voltage NOR that can be driven toward a first charge/discharge potential (Vsupp2) at a rate that can depend upon how many input signals (M1 to Mn) are active. The dynamic reference node 104 can provide a "dynamic" reference voltage VREF. The reference voltage VREF can be considered "dynamic" in that it can vary over time. The rate at which the reference voltage VREF changes can be related to the possible rates at which the detect voltage NOR can change. In particular, the rate at which the reference voltage VREF can change can be between the rate at which the detect voltage NOR changes in response to one active input signal and the rate at which the detect voltage NOR changes in response to two active input signals.

It is understood that the above-described rates are not necessarily constant or linear. The rate at which a detect voltage NOR and/or a reference voltage VREF can change can follow a resistance-capacitance (RC) time constant or some other non-linear or linear response.

The first node can be driven toward a Vsupp2 potential by a number of detect devices 106-1 to 106-n. Detect devices 106-1 to 106-n can receive input signals M1 to Mn, respectively. Each detect device (106-1 to 106-n) can include an impedance path that is controlled by its corresponding input signal (M1 to Mn). A detect device (106-1 to 106-n) can be enabled or disabled according to its input signal. When enabled, a detect device (106-1 to 106-n) can provide a low impedance path between potential Vsupp2 and detect node 102. When disabled, a detect device (106-1 to 106-n) can provide a high impedance path between potential Vsupp2 and detect node 102.

In this way, in the first embodiment 100, the potential on the detect node 102 can vary according to the number of active input signals. As more signals are active, the detect node 103 can be driven toward the Vsupp2 potential at a faster rate.

In one particular arrangement, the low impedance paths provided by each detect device (106-1 to 106-n) can be equivalent to one another.

One approach to forming a dynamic reference voltage on the dynamic reference node 104 can include activating a reference device 108. The reference device 108 can receive a reference signal Mref. The reference device 108 can include an impedance path that is controlled by the reference signal Mref. When the Mref signal is active, the reference device 108 can be enabled, and can provide a low impedance path between potential Vsupp2 and reference node 104. When the MREF signal is inactive, the reference device 108 can be disabled, and can provide a high impedance path between potential Vsupp2 and detect node 102.

In one particular arrangement, the size of the impedance path of the reference device 108 can be greater than that provided by one detect device, and less than that provided by two detect devices.

It is noted that in a particular arrangement, the activation of any input signals can be essentially simultaneous with the activation of the Mref signal. In this way, the detect node 102 and reference node 104 can begin being driven toward the Vsupp2 potential at the same time. Rate differences can result in the development of a particular differential voltage between the detect node 102 and reference node 104. When more than one input signal (M1 to Mn) is active, the differential voltage can have a first polarity. When one or no input signals are active, the differential voltage can have a second polarity. In this way, a differential voltage between the detect node 102 and reference node 104 can indicate a multiple (active) signal state.

In the particular arrangement of FIG. 1, a differential voltage between the detect node 102 and reference node 104 can be amplified by an amplifier 110. Accordingly, the output of the amplifier 110 can provide the MM signal.

A multiple signal detect circuit 100 can further include a precharge (or predischarge) circuit 112. The precharge circuit 112 can be activated according to a precharge signal /PRECH. When activated, the precharge circuit 112 can provide a low impedance path between a precharge potential (Vsupp1) and the detect node 102 and reference node 104. When inactive, the precharge circuit 112 can provide a high impedance path between a precharge potential (Vsupp1) and the detect node 102 and reference node 104. This can allow the detect node 102 and reference node 104 to be driven toward the Vsupp2 potential in response to the reference signal Mref and any active input signals (M1 to Mn).

Thus, in a typical operation the /PRECH signal can activate, and then deactivate the precharge circuit 112, thereby precharging (or predischarging) the detect node 102 and reference node 104 to the Vsupp1 potential. Subsequently, the reference signal Mref can be activated. At the same time, one or more of the input signals (M1 to Mn) may be activated.

Figure 2:
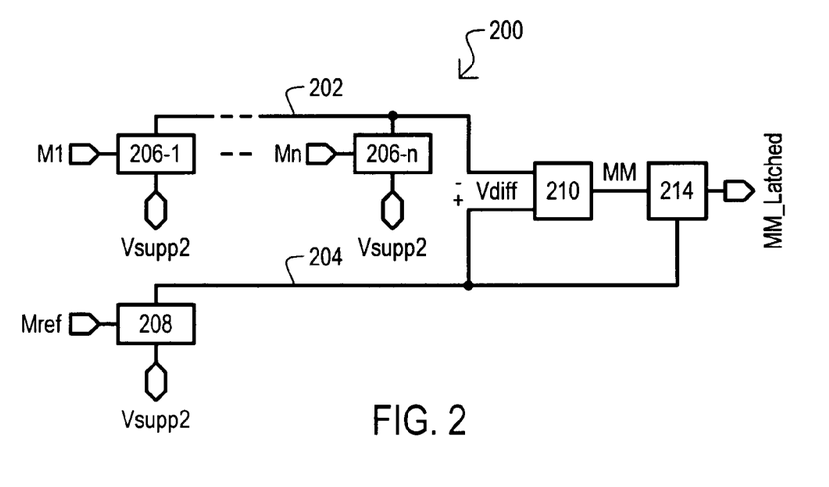
FIG. 2 is a block diagram of a multiple signal detection circuit according to a second embodiment.

Referring now to FIG. 2, a second embodiment is set forth in a block diagram and designated by the general reference character 200. The second embodiment 200 can receive a number of input signals (M1 to Mn) and a reference signal Mref, and provide an output signal MM. The second embodiment 200 can include some of the same constituents as the first embodiment 100, including a detect node 202, a reference node 204, detect devices 206-1 and 206-n, and a reference device 208.

In the same general fashion as the first embodiment 100, the second embodiment 200 can generate a differential voltage between the detect node 202 and the reference node 204 that can indicate a multiple active signal condition. Unlike the first embodiment 100, in the second embodiment 200, a multiple active signal indication can be stored according to the potential of the reference node 204.

In the particular example of FIG. 2, the differential voltage between the detect node 202 and reference node 204 can first be amplified by amplifier 210. This value can then be stored by a latching circuit 214. The latching circuit 214 can be activated according to the potential of the reference node 204.

In operation, the reference signal Mref can be activated. In addition, one or more input signals (M1 to Mn) can be activated. Differences between the rate at which the detect node 202 and reference node 204 are driven to a Vsupp2 potential can develop a differential voltage between the nodes (202 and 204). The differential voltage can be amplified by amplifier 212 and output as the MM signal.

The latching circuit 214 can receive the VREF voltage as a control input. As noted above, following the activation of the Mref signal, the potential at the reference node 204 will approach the Vsupp2 potential. Once the VREF voltage is within a certain range of the Vsupp2 potential, the latching circuit 214 can latch the MM value, and provide it as a latched output value MM_Latched. The latching point of the latching circuit 214 can be set to latch the MM value after it has been sufficiently developed by the amplifier 218. Looked at in another way, a differential voltage indicating a multiple signal case can be developed before the reference voltage VREF changes enough to activate latching circuit 214.

In this way, a multiple signal indication circuit can utilize a dynamic reference voltage to develop a differential voltage to indicate a multiple signal case. A multiple signal case indicator can then be latched according to the dynamic reference voltage.

Figure 3:
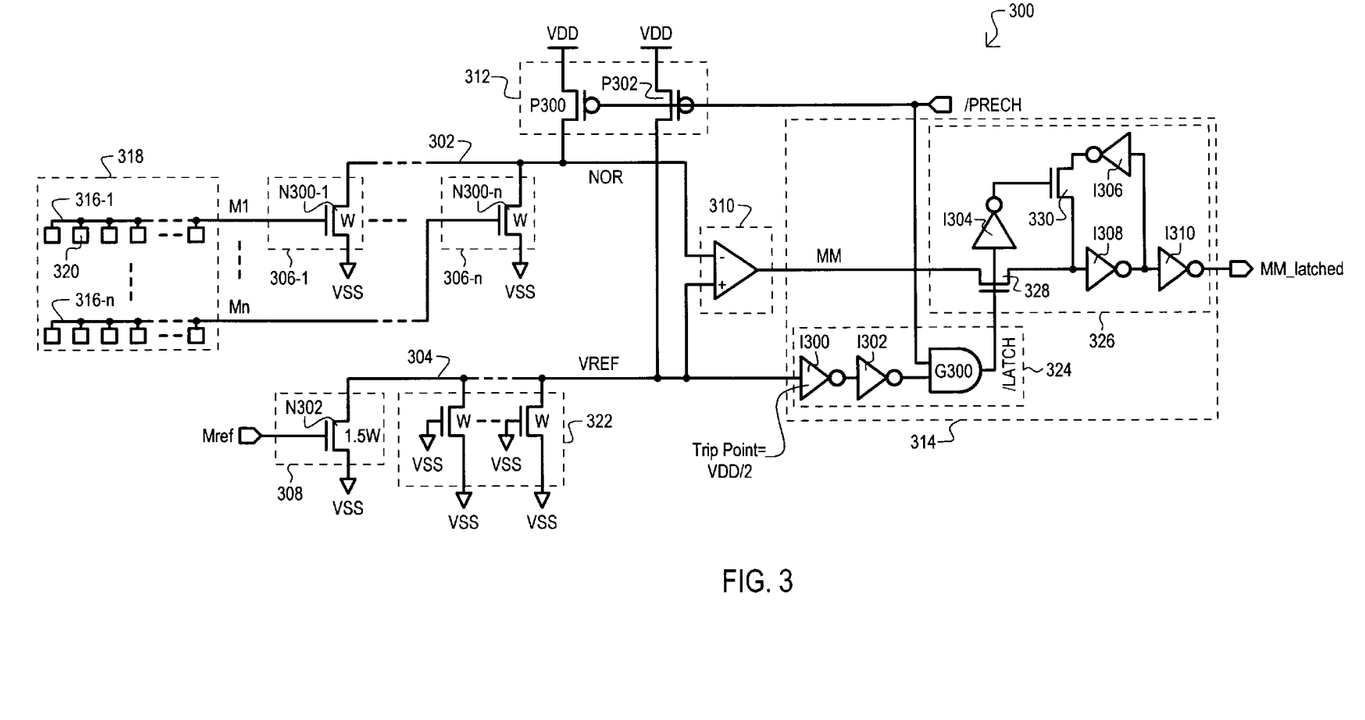
FIG. 3 is a schematic diagram of a multiple signal detection circuit according to a third embodiment.

Referring now to FIG. 3, a multiple match detect circuit according to a third embodiment is set forth in a schematic diagram. The multiple match detect circuit is designated by the general reference character 300, and can be used in a content addressable memory (CAM) to indicate more than one match between an applied comparand value and a number of stored data values. The third embodiment 300 can receive a number of match signals (M1 to Mn), and can generate a multiple match indication MM when more than one match signal (M1 to Mn) is activated.

The third embodiment includes a detect node 302, reference node 304, detect devices 306-1 to 306-n, a reference device 308, an amplifier 310, a precharge circuit 312, and a latching circuit 314.

Detect node 302 can develop a detect voltage NOR that can vary according to the number of active match signals (M1 to Mn). Variation in the detect voltage NOR can be developed by detect devices (306-1 to 306-n). In the particular arrangement of FIG. 3, each detect device (306-1 to 306-n) can be an n-channel insulated gate field effect transistor (N300-1 to N300-n). Each transistor N300-1 to N300-n can have a channel width "W." The drains of transistors N300-1 to N300-n can be coupled to the detect node. The sources of transistors N300-1 to N300-n can be coupled to a low power supply voltage VSS. The gates of transistors N300-1 to N300-n can receive match signals M1 to Mn. N-channel field effect transistors can provide a compact circuit size and rapid discharge response.

In this way, turning on various detect devices (306-1 to 306-n) can generate an impedance response that varies according to the number of active match indications. If one match indication is active, the impedance response includes the source-drain path of the activated transistor. If two match indications are active, the impedance response includes the source-drain paths of two activated transistors.

Match signals M1 to Mn can be generated on match lines 316-1 to 316-n. The match lines (316-1 to 316-n) can be coupled to a CAM cell array 318. In one particular arrangement, each match line (316-1 to 316-n) can be coupled to a row of CAM cells (one of which is shown as item 320).

Reference node 304 can develop a reference voltage VREF that can vary in response to a reference signal Mref. Variation in the reference voltage VREF can be developed by the reference device 308. In the particular arrangement of FIG. 3, the reference device 308 can be an n-channel insulated gate field effect transistor N302. Transistor N302 can have a channel width that is greater than W but less than 2 W. In the example of FIG. 3, transistor N302 can have the same channel length as transistors N306-1 to N306-n, but can have a width of 1.5 W. In this way, the rate at which the reference node 304 discharges can be greater than the rate at which the detect node 302 discharges when one match line is active, but less than the rate at which the detect node 302 discharges when two or more match lines are active. Transistor N302 can have a gate that receives a reference signal Mref, a drain coupled to the reference node 304, and a source coupled to the power supply voltage VSS.

In this way, turning on the reference device 308 can generate a reference impedance response. The reference impedance response can include the source-drain path of the activated reference transistor. In the particular arrangement of FIG. 3, due to the channel width differences between the reference transistor N302 and the various detect transistors N300-1 to N300-n, the impedance response will vary from those provided by the detect devices (306-1 to 306-n). In particular, the reference impedance response will be between that provided by two active detect transistors and one active detect transistor.

To assist in providing the desired discharge rate between the detect node 302 and reference node 304, the third embodiment 300 can further include a "dummy load" 322. The dummy load 322 can include a number of dummy devices that can have similar responses to the detect devices 306-1 to 306-n. In the particular example of FIG. 3, the dummy devices can be dummy n-channel transistors having the same size as transistors N300-1 to N300-n, and can provide an equivalent capacitance as the detect device transistors. The dummy transistors can have their drains coupled to the reference node 304, their sources and gates coupled to the power supply voltage VSS. Such an equivalent capacitance can include not only junction capacitance, but may also include parasitic capacitance formed from conductive lines.

It is understood that while the third embodiment 300 can provide a desired impedance response by changing the transistor channel width (W) of a reference device 308 with respect to the transistors Ws of detect devices (306-1 to 306-n), other approaches can be used to generate different impedance responses. As just two examples, transistor channel lengths (Ls) and/or W/L ratios can be set to provide a desired difference impedance responses.

It is also understood that while matching dummy devices can be a particularly advantageous way of creating similar discharge (or charge) responses between a detect node and reference node, the present invention is not limited to such structures. As just one example, one or more larger capacitive structures could be coupled to the reference node to match a larger number of detect transistors.

Matching dummy devices may also make the resulting circuit less susceptible to noise and other possibly disturbing events due to capacitive coupling. When manufactured in an integrated circuit, dummy devices may provide an identical response to detect devices.

In the particular example of FIG. 3, detect devices (such as 306-1 to 306-n) may be matched (have the same size, and be manufactured in an essentially identical fashion). In this arrangement, the activation of each input signal (such as M1 to Mn) has equal weight in discharging (or charging) a detect node. Of course, alternate embodiments could utilize different size detect devices in the event it was desirable to weight particular input signals with respect to others.

It is also understood that while the particular arrangement of FIG. 3 can provide equivalent discharge (or charge) responses with related active device sizing and essentially matching node capacitance, the present invention is not limited thereto. A smaller reference node capacitance could be utilized with a correspondingly smaller reference device 308. Conversely, a larger reference node capacitance could be used with a larger reference device 308.

It is further understood that "dummy" devices (not necessarily limited to transistors) can be programmable by way of metallization option and/or fusible link to name but two examples. Such an arrangement can allow for adjustments to the reference node capacitance that can optimize the response of the circuit.

The amplifier 310 can include a differential sense amplifier that can rapidly detect and amplify differential voltages between the detect and reference nodes (302 and 304). The differential sense amplifier can have a minus (−) input coupled to the detect node 302 and a plus (+) input coupled to the reference node 304. In this particular arrangement, when the potential of the detect node 302 is greater than that of the reference node 304, the output of the differential sense amplifier can be driven low, indicating one or zero active match indications. Conversely, when the potential of the detect node 302 is less than that of the reference node 304, the output of the differential sense amplifier can be driven high, indicating two or more match indications. A differential-type amplifier can provide for rapid sensing of differential voltages. Such amplifiers can have compact circuit structures as well.

The precharge circuit 312 of FIG. 3 is shown to include two p-channel insulated gate field effect transistors P300 and P302. Transistors P300 and P302 can precharge the detect node 302 and reference node 304, respectively, to a precharge voltage VDD. The sources of transistors P300 and P302 are coupled to the VDD voltage, and the gates of transistors P300 and P302 are commonly coupled to the /PRECH signal. The drain of transistors P300 and P302 are coupled to the detect node 302 and reference node 304, respectively. P-channel field effect transistors can provide for compact circuit sizes and rapid charge responses.

It is understood that while the particular arrangement of FIG. 3 includes a precharge circuit that can precharge a node from a lower potential to a higher potential, alternate embodiments could pre(dis)charge nodes from a higher potential to a lower potential. Accordingly, the term "precharge" as used in this disclosure should not be construed as being limited to a particular polarity change in potential.

The latching circuit 314 can include a control section 324 and a latch section 326. A control section 324 can monitor the potential of the reference node 304. When the reference node 304 falls below a predetermined value, the controls section 324 can provide a latch signal /LATCH. The latch signal can cause the latch section 326 to "latch" the MM value output from the amplifier 310.

The above-described latching arrangement can allow for a multiple match detect value MM to be "safely" latched before a differential voltage "shrinks" to an undeterminable value, contributing to the rapid sensing of MM values.

In the particular arrangement of FIG. 3, the control section 324 can include a first inverter I300, second inverter I302, and an enable gate G300. The first inverter I300 can have a "trip point" of VDD/2. That is, provided the input to inverter I300 is greater than VDD/2, the output of the inverter I300 will be low. When the input is less than VDD/2, the output of inverter I300 will be high.

It is understood that while a particular logic circuit (an inverter) has been used to detect a trip potential, such a singular arrangement should not be construed as limiting to the present invention. Other types of circuits could be used for such a purpose. As but two limited examples, a different type of logic circuit can be designed to have a particular trip point, or a differential amplifier can detect when a trip point is reached.

It is also understood that the particular VDD/2 trip point should not be construed as limiting. As just one example, other trip points can be selected according to when an MM value has been developed. More "aggressive" approaches can use a higher trip point, provided the MM value has been determined by the time the reference node reaches such a value.

Referring back to FIG. 3, Inverter I302 is arranged in series with inverter I300. Enable gate G300 is an AND gate having one input that receives the /PRECH signal and another that receives the output of inverter I302. Enable gate G300 can provide the /LATCH signal.

When the /PRECH signal is low, the enable gate G300 is disabled, and the /LATCH signal is forced low. When the /PRECH signal is high, the /LATCH signal is driven according to the potential of the reference node 304.

The latch section 326 is shown to include a passgate 328, a latch gate 330, and inverters I304, I306, I308 and I310. Passgate 328 is enabled when the /LATCH signal is high and disabled when the /LATCH signal is low. Inverter I304 results in latch gate 330 being enabled when /LATCH is low and disabled when /LATCH is high. Cross-coupled inverters I306 and I308 can form a storage circuit. Inverter I310 can invert the value in the storage circuit.

Having described the configuration of a third embodiment 300, the operation of the third embodiment 300 will now be described in conjunction with a timing diagram set forth in FIGS. 4A and 4B.

Figure 4A:
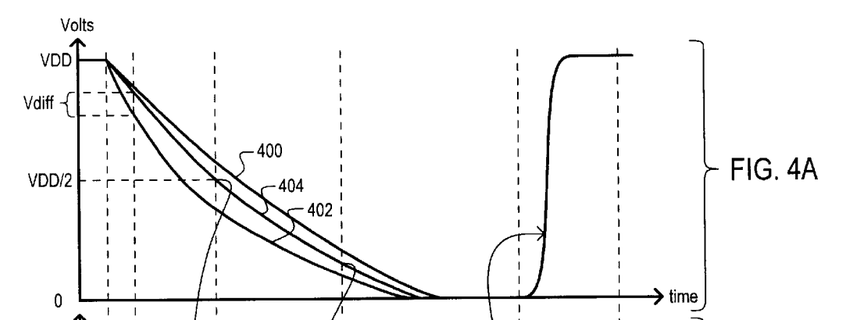
FIG. 4A is a timing diagram illustrating the response of the circuit set forth in FIG. 3.

FIG. 4A is a timing diagram illustrating two different responses (400 and 402) of the detect node 302 and the response 404 of the reference node 304. Response 400 is one example of the potential of the detect node 302 when one match signal (M1 to Mn) is activated. Response 402 is one example of the potential of the detect node 302 when two match signals (M1 to Mn) are activated. Response 404 is an example of the potential of the reference node 304.

Figure 4B:
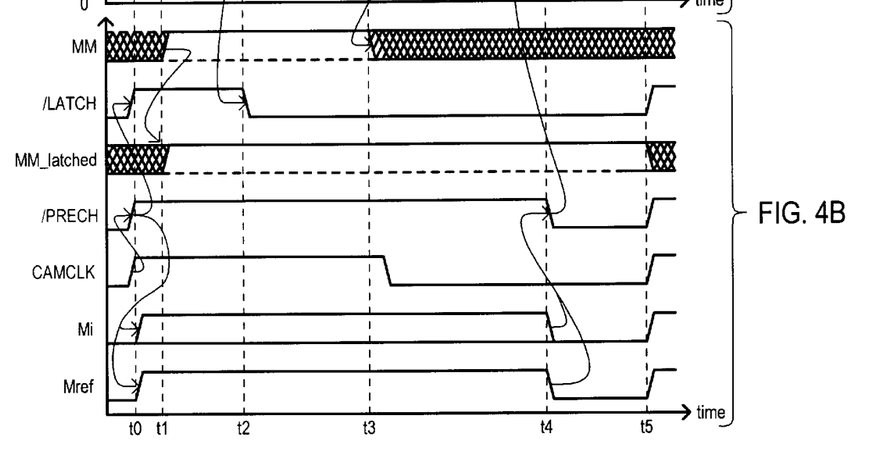
FIG. 4B is a timing diagram illustrating the operation of the circuit set forth FIG. 3.

FIG. 4B is a timing diagram setting forth various signals of the circuit set forth in FIG. 3, including the multiple match indication MM, the latch signal /LATCH, the precharge signal /PRECH, the various match signals Mi, and the reference signal Mref Also included in FIG. 4B is a MM_Latched waveform that represents the output of latching circuit 314, and a clock signal CAMCLK, that can be used to control a CAM.

Referring now to FIGS. 4A and 4B, prior to time t0, the /PRECH signal is low, and the detect node 302 and reference node 304 are precharged to a VDD potential.

At about time t0, the CAMCLK signal transitions high. In response to the activation of the CAMCLK signal, the /PRECH signal can be driven high, turning off transistors P300 and P302 within precharge circuit 312. The reference signal Mref can then be activated, and any number (including zero) of match signals (Mi) can be activated. The activation of the Mref signal can result in the reference node 304 being discharged to a VSS potential. In the example of FIG. 4A, this discharge operation is shown by waveform 404.

In the event one match signal is active, the detect node 302 can be discharged to VSS at a slower rate than the reference node 304. This is shown by waveform 400. In the event two match signals are active, the detect node 302 can be discharged to VSS at a faster rate than the reference node 304. This is shown by waveform 402. It is understood that in the event no match signals are activated, the detect node 302 will not discharge. Further, in the event three or more match signals are activated, the discharge rate of the detect node 302 can be faster than the two active match signal case 402.

Following the activation of the Mref signal (and any match signals Mi) a differential voltage can begin to be developed between the detect node 302 and the reference node 304.

Due to the different discharge rates, the differential voltage developed between the reference node response 404 and single match signal response 400 can result in a negative differential voltage input to the amplifier 310. Consequently, the MM value will remain low. This is illustrated by the dashed portion of the MM waveform. This low value will propagate through, and eventually be latched by latching circuit 314 to generate a low MM_Latched value.

Also due to the different discharge rates, at about time t1, the differential voltage developed between the reference node response 404 and two match signal response 402 can result in a positive differential voltage (Vdiff) input to the amplifier 310 that can drive the MM signal high. As shown by FIG. 4B, the high MM value can propagate through, and eventually be latched by, latching circuit 314 to generate a high MM_Latched value.

As the detect operation proceeds, as shown by FIG. 4A, the reference node 304 potential continues to fall, as shown by its response 404. At about time t2, the reference node 304 potential reaches VDD/2. As the reference node 304 becomes less than VDD/2, due to the trip point of inverter I300, the output of inverter I300 will be driven high. This value is inverted by inverter I302 and provided as an input to gate G300. As a result, the previously high /LATCH value is driven low. Within the latch section 326, the passgate 328 is turned off, isolating the output of amplifier 310 from storage circuit I306/I308. Further, by operation of inverter I304, latch gate 330 is turned on, enabling the storage circuit I306/I308, and thereby latching the MM_Latched value.

At about time t3, the magnitude of the differential voltage between the reference node response 404 and the two match signal response 402 can be too small to be consistently detected by the amplifier 310. However, because the value has been previous latched (at about time t2), the desired MM value is provided as the MM_Latched value.

At about time t4, the /PRECH signal transitions low, activating the precharge circuit 312. Within the precharge circuit 312 transistors P300 and P302 can be turned on, providing a low impedance path between the supply voltage VDD and the detect node 302 and reference node 304. Thus, at about time t4, the detect node 302 and reference node 304 are driven toward the VDD potential.

At about time t5, the CAMCLK signal can return to a high logic level, and the signal detect operation can be repeated. The CAMCLK signal can be a timing signal that is synchronous with an external clock signal. However, the CAMCLK signal can also be asynchronous (a "self-timed" clock as just one example).

Figure 7:
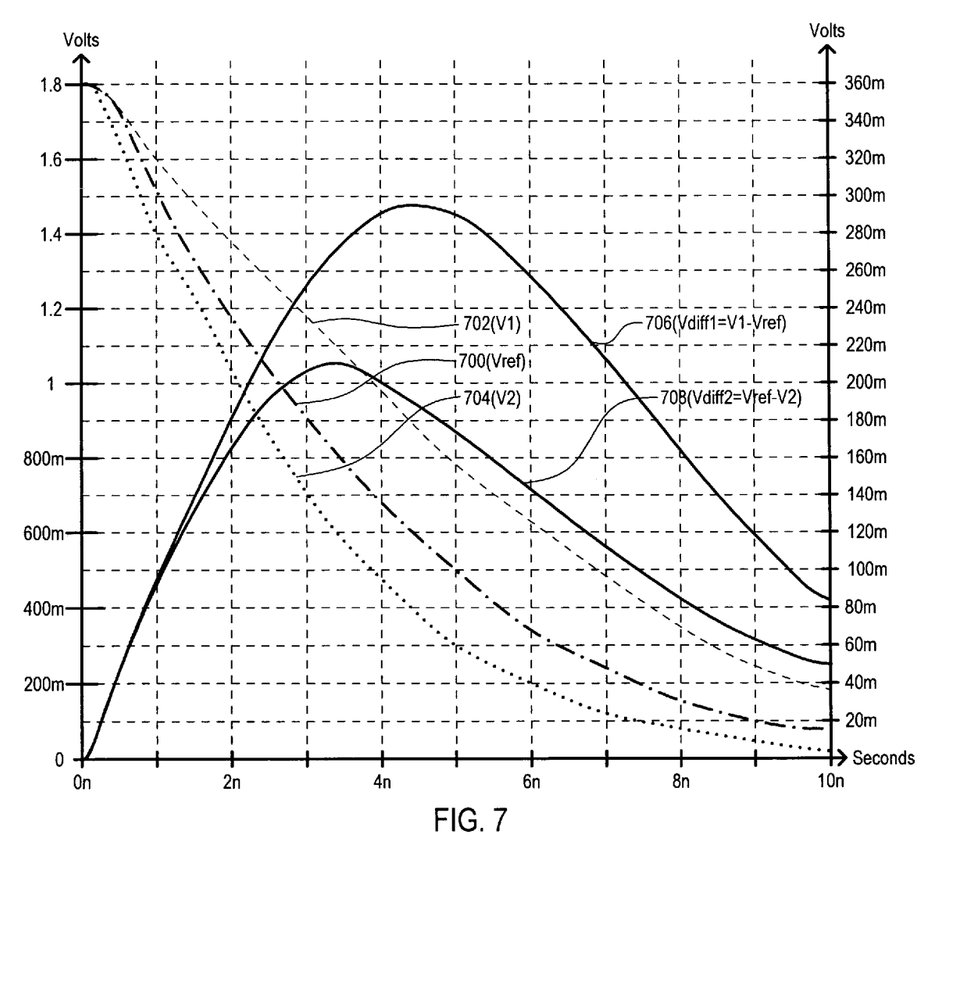
FIG. 7 is a more detailed timing diagram illustrating the operation of the circuit set forth in FIG. 3.

Referring now to FIG. 7, a more detailed timing diagram is set forth illustrating the operation of the circuit set forth in FIG. 3. The timing diagram includes a number of waveforms and two vertical voltage scales. Waveform 700 illustrates the response of a reference node (such as 304) Vref. Two responses of detect nodes (such as 302) are shown as 702 and 704. Waveform 702 (V1) illustrates a response when one match signal is activated. Waveform 704 (V2) illustrates a response when two match signals are activated. The leftmost voltage scale is for waveforms 700, 702 and 704.

Also included in FIG. 7 are two differential voltage waveforms 706 and 708. Waveform 706 (Vdiff1) represents the differential voltage between a reference node and a detect node when one match signal is activated (i.e., Vdiff1=V1-Vref). Waveform 708 (Vdiff2) represents the differential voltage between a reference node and a detect node when two match signals are activated (i.e., Vdiff2=Vref-V2). The rightmost voltage scale is for differential waveforms 706 and 708.

It is understood that while the various embodiments have utilized detect devices and references devices that can have generally two different states (i.e., "on" or "off"), alternate approaches could utilize different arrangements to generate dynamic discharge (or charge) rates. As just one example, the gate voltage of one or more field effect transistors could be modulated to achieve variable discharge (or charge) rates between a detect node and reference node.

Along these same lines, it is understood that impedance paths that can be provided by detect devices and reference devices do not necessarily provide the same impedance values during a multiple signal detect operation. As just one example, if field effect transistors are used in detect and/or reference devices, the impedance of the source-drain path can vary as the source-drain voltage of the transistor varies. As noted above, changes in gate voltage could also affect impedance of such transistors.

Further, while the various embodiments have illustrated arrangements that can indicate when more than two input signals are active, alternate embodiments can be used to distinguish a higher number of active signals and/or a range of active signals. As just two examples, the present invention may be used to distinguish between "m" and "m+1" active signals, where m is an integer greater than two. The present invention may also be used to distinguish between "m" and "m+k" active input signals, where "k" is an integer greater than one. In the latter case a circuit may include a region of uncertainty when the number of active input signals is greater than m but less than m+k.

While the multiple signal detect circuits according to the present invention can have a variety of applications, such circuits may be particularly advantageous when utilized in CAMs, where rapid multiple match detection can be a valuable feature. Of course, one skilled in the art would understand that the teachings set forth herein can be utilized in various CAM arrangements, including both binary and ternary CAMs.

Further, while the CAM applications discussed have referred to network related applications, such a multiple match approach can be utilized in other CAM applications. As just one example, a multiple match detect circuit according to the present invention could be utilized in conjunction with a processor that accesses a "virtual" memory. More particularly, a processor can access a virtual memory with "effective" addresses. Effective addresses can be translated into physical addresses by a translation lookaside buffer (TLB). A TLB can include a CAM that is used to map effective addresses to physical addresses. A multiple map detection circuit according to the preferred embodiment can be used to indicate a multiple match condition in a TLB operation. Such a multiple match condition can indicate an erroneous state, as an effective address would be mapped to more than one physical address.

Thus, while the preferred embodiments set forth herein have been described in detail, it should be understood that the present invention could be subject to various changes, substitutions, and alterations without departing from the spirit and scope of the invention. Accordingly, the present invention is intended to be limited only as defined by the appended claims.

What is claimed is:

1. A multiple signal detect circuit, comprising:
    a detect node;
    a reference node;
    at least one detect controllable impedance path between the detect node and a first potential, the detect controllable impedance path having
        a first impedance response that can allow the detect node to approach the first potential at a first rate when one input signal is active, and
        a second impedance response that can allow the detect node to approach the first potential at a second rate when two input signals are active; and
    at least one reference controllable impedance path between the detect node and a first potential, the reference controllable impedance path having a reference impedance response that can allow the reference node to approach the first potential at a reference rate when a reference signal is active, the reference rate being between the first rate and the second rate.

2. The multiple signal detect circuit of claim 1, wherein:
    the at least one detect controllable impedance path includes a plurality of detect field effect transistors (FETs), each detect FET having
        a source-drain path coupled between the detect node and the first potential,
        a gate coupled to an input signal,
        a channel width-to-length ratio (W/L) of a first size, and
    the first impedance response includes the activation of one detect FET and the second impedance response includes the activation of two detect FETs.

3. The multiple signal detect circuit of claim 2, wherein:

the at least one reference controllable impedance path includes at least one reference FET having a source-drain path coupled between the reference node and the first potential, a gate coupled to the reference signal, and a channel W/L ratio of a second size, the second size being larger than the first size and smaller than twice the first size.

4. The multiple signal detect circuit of claim 3, further including:

a plurality of dummy FETs having source-drain paths coupled between the reference node and the first potential, gates and sources coupled to the first potential, and channel W/L ratios of the first size.

5. The multiple signal detect circuit of claim 1, further including:

an amplifier having a first input coupled to the detect node and a second input coupled to the reference node.

6. The multiple signal detect circuit of claim 5, wherein:

the amplifier includes a differential amplifier.

7. The multiple signal detect circuit of claim 1, further including:

a precharge circuit including
a first controllable impedance path coupled between the detect node and a second potential, and
a second controllable impedance path coupled between the reference node and the second potential.

8. The multiple signal detect circuit of claim 7, wherein:

the first controllable impedance path includes a precharge FET having a source-drain path coupled between the detect node and the second potential and a gate coupled to a precharge signal; and the second controllable impedance path includes a precharge FET having a source-drain path coupled between the reference node and the second potential and a gate coupled to the precharge signal.

9. A multiple signal detect circuit, comprising:

a detect node having a detect potential that can vary from a first voltage at a first rate when one input signal is active and vary from the first voltage at a second rate when two input signals are active;

a reference node having a reference potential that can vary from the first voltage at a reference rate when a reference signal is active, the reference rate being between the first rate and the second rate;

an amplifier having a first input coupled to the detect node, a second input coupled the reference node, and an amplifier output; and a latching circuit having a latch input coupled to the amplifier output, the latching circuit latching an amplifier output value according to the reference potential.

10. The multiple signal detect circuit of claim 9, wherein:

the latching circuit includes
a control section having an input coupled to the reference node that can activate a latch signal when the reference potential is at a trip potential, the trip potential being a potential that varies from the first potential by a predetermined amount, and
a latch section that can latch an amplifier output value when the latch signal is active.

11. The multiple signal detect circuit of claim 10, wherein:

the control section includes a logic circuit having a trip point at the trip potential.

12. The multiple signal detect circuit of claim 10, wherein:

the latch circuit includes
a storage circuit, and
a pass gate coupled between the amplifier output and the storage circuit that is enabled when the latch signal is inactive, and disabled when the latch signal is active.

13. The multiple signal detect circuit of claim 12, wherein:

the storage circuit includes
a first inverter cross-coupled with a second inverter, and
a latch gate coupled between the input of the first inverter and the output of the second inverter that is disabled when the latch signal is inactive, and enabled when the latch signal is active.

14. A content addressable memory (CAM) multiple match detection circuit, comprising:

an array of CAM cells;

a plurality of signal nodes coupled to the array of CAM cells, each signal node providing a signal;

a detect node;

a reference node;

a plurality of detect devices coupled between the detect node and a first potential, each detect device being further coupled to a signal and providing a low impedance path between the detect node and the first potential when its corresponding signal is activated;

at least one reference device coupled between the reference node and the first potential, the reference device being further coupled to a reference signal and providing a low impedance path between the reference node and the first potential when the reference signal is activated; and a precharge circuit that can receive a precharge signal and provide low impedance paths between a second potential and the detect and reference nodes when the precharge signal is active.

15. The multiple match detection circuit of claim 14, wherein:

each signal node is coupled to a row of CAM cells, and each signal provides comparison result between a comparand value and a data value.

16. The multiple match detection circuit of claim 14, wherein:

the CAM includes a plurality of entries, each entry including a plurality of CAM cells that store a data value; and each signal indicates when an entry stores a data value.

17. The multiple match detection circuit of claim 14, wherein:

each detect device can include an insulated gate field effect transistor (IGFET) of a first conductivity type having a source-drain path coupled between the detect node and the first potential and a gate coupled to a match signal, the channel width-to-length ratio of each detect device transistor being a value Z.

18. The multiple match detection circuit of claim 17, further including:

a plurality of dummy devices coupled to the reference node, each dummy device including an IGFET of the first conductivity type and a channel width-to-length ratio of Z.

19. The multiple match detection circuit of claim 14, wherein:

the at least one reference device can include an IGFET of the first conductivity type having a source-drain path coupled between the detect node and the first potential, the channel width-to-length ratio of the reference device transistor being greater than Z and less than 2 Z.

20. The multiple match detection circuit of claim 14, further including:

an amplifier having a first input coupled to the detect node and a second input coupled to the reference node and an amplifier output; and a latching circuit that can latch the amplifier output when the reference node varies from the second potential by a predetermined amount.

* * * * *